US006946731B2

(12) United States Patent
Chang et al.

(10) Patent No.: US 6,946,731 B2
(45) Date of Patent: Sep. 20, 2005

(54) LAYOUT STRUCTURE FOR PROVIDING STABLE POWER SOURCE TO A MAIN BRIDGE CHIP SUBSTRATE AND A MOTHERBOARD

(75) Inventors: Nai-Shung Chang, Taipei Hsien (TW); Shu-Hui Chen, Taipei Hsien (TW); Tsai-Sheng Chen, Taipei Hsien (TW); Chia-Hsing Yu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 185 days.

(21) Appl. No.: 10/173,231

(22) Filed: Jun. 14, 2002

(65) Prior Publication Data

US 2003/0042566 A1 Mar. 6, 2003

Related U.S. Application Data

(60) Provisional application No. 60/315,521, filed on Aug. 28, 2001.

(30) Foreign Application Priority Data

Feb. 22, 2002 (TW) ........................................ 91103102 A

(51) Int. Cl.$^7$ .............................................. H01L 23/34
(52) U.S. Cl. ........................ 257/724; 257/691; 257/784; 257/700
(58) Field of Search ................................. 257/724, 691, 257/784, 700

(56) References Cited

U.S. PATENT DOCUMENTS

| 5,811,880 A | * | 9/1998 | Banerjee et al. | 257/724 |
| 5,847,451 A | * | 12/1998 | Ohtaki et al. | 257/697 |
| 5,925,925 A | * | 7/1999 | Dehaine et al. | 257/659 |

* cited by examiner

Primary Examiner—Luan Thai
(74) Attorney, Agent, or Firm—J. C. Patents

(57) ABSTRACT

This invention relates to a layout structure for providing stable power supply to a four-layer motherboard and a main bridge chip substrate. In the invention, on the top signal layer and power path of the bottom solder layer for layout of the main bridge chip and on the power ring, the decoupling capacitors are connected in between the ground bonding pads/solder balls and the power bonding pads/solder balls of the power paths and power rings, so as to provide a stable power supply for the operation of the main bridge chip. In this invention, the ground bonding pad/solder ball connected with each power bonding pad/solder ball can be the closest ground bonding pad/solder ball to the power bonding pad/solder ball. In addition, in the embodiment of the main bridge chip substrate, decoupling capacitors can be disposed at four corners of the power ring or underneath the bonding wires, or can be packaged inside the molding compound.

11 Claims, 6 Drawing Sheets

LAYOUT STRUCTURE FOR PROVIDING STABLE POWER SOURCE TO A MAIN BRIDGE CHIP SUBSTRATE AND A MOTHERBOARD

CROSS-REFERENCE TO RELATED APPLICATION

This application claims the priority benefits of U.S. provisional application titled" "BALLOUT AND SUBSTRATE DESIGN SCHEME FOR CHIPSETS" filed on Aug. 28, 2001, Ser. No. 60/315,521. All disclosure of this application is incorporated herein by reference. This application also claims the priority benefit of Taiwan application serial no. 91103102, filed Feb. 22, 2002.

BACKGROUND OF THE INVENTION

1. Field of Invention

This invention relates to a layout structure for providing a stable power source More particularly, this invention relates to a layout structure for providing stable power source to a main bridge chip substrate and a motherboard.

2. Description of Related Art

With fast developing technology, the operation speed of computers is getting faster and faster. Taking Intel Pentium 4 as an example, the CPU bus speed can reach 532 MHz (133 MHz×4). This means that the main bridge chip is required to provide higher bus speed on other buses to work with the peripheral components connected to it. The buses include the memory bus with the speed of 333 MHz (166 MHz×2), the AGP bus with the speed of 528 MHz (66 MHz×8) and the main-subalternate connecting bus with the speed of 66 MHz×8. In addition to the high operation speed in requirement, the layout of the main bridge chip substrate as well as the motherboard have to be well designed in order to achieve stable operations for the above devices. Normally, certain design sequences have to be followed during designing the layout of the main bridge chip and motherboard. For example, in order to stabilize a good signal quality on the signal layer, a ground layer has to be provided on the main bridge chip substrate or the motherboard, close to the signal layer, so that all the signals on the signal layer can be referenced to the ground layer.

However, the existing signal-referencing method mentioned above often has some problems depending on how the layout is designed for the main bridge chip substrate and the motherboard FIG. 1 shows a conventional circuit layout for the main bridge chip substrate and the motherboard, wherein there are 4 layers from top to bottom by the top signal layer 11, the ground layer 12, the power source layer 13, and the bottom solder layer 14 respectively. In the conventional layout for the motherboard and the main bridge chip substrate, almost all of the signals in layout are arranged the top signal layer 11, so that the signal lines can be referenced to the ground layer 12. On the other hand, various types of power sources can be obtained through the layout and partition on the power source layer 13. Moreover, the bottom solder layer 14 of the main bridge chip substrate normally contains the solder balls for soldering to the motherboard. Also and, the other circuits for which the signal quality is not critical can also be arranged into this bottom solder layer 14. However, when the main bridge chip needs an even higher bus speed (higher than 1 GHz for example), the layout of the main bridge chip substrate and the motherboard becomes very important because it consumes more power for the relating controllers and the interfaces The layout of the power source is then a rather more important issue.

FIG. 2 shows a schematic diagram of an existing layout structure of the main bridge chip on the power source layer 13 of the motherboard 200, where the partition of the power layer 13 is also indicated in FIG. 2. Furthermore, FIG. 2 also shows many bonding pads which are located at the top signal layer 11 and are connected with the power layer 13 through the vias. It should be noted that the bonding pads must be arranged and positioned according to the locations of the related components. As for the main bridge chip substrate, it is connected with the bonding pad of the motherboard through the solder balls arranged at the bottom solder layer 14, so that the main bridge chip can obtain the related working voltages and proceed the work.

In FIG. 2, it further comprises multiple working connection regions. The CPU working connection region 201 represents the region where the main bridge chip and the CPU are connected together. This region includes the signal bonding pads for connecting to the CPU. The region also includes some ground bonding pads (the black dots) and some CPU power bonding pads (marked with "T"). The CPU power ring 201A, more particularly, represents a region of the power ring on the main bridge chip, wherein the CPU working connection region 201 is connected with the CPU power bonding pads. In addition, the memory working connection region 202 represents the region in which bonding pads are located for connecting the main bridge chip and the memory locates. The bonding pads include the signal bonding pads for connecting the memory (SRAM for example), and also some ground bonding pads as well as some memory power bonding pads (marked with "M"). The memory power ring 202A represents a region of the main bridge chip power ring, which is the region located in the memory working connection region 202 and being connected to the memory power bonding pads. Furthermore, the subalternate bridge working connection region 203 represents the bonding pad region where the main bridge chip and the subalternate bridge are connected. These bonding pads include not only the signal bonding pads connecting to the subalternate bridge chip, but also several ground bonding pads and subalternate bridge power bonding pads (marked as "V"). The subalternate bridge power ring 203A represents a region of the main bridge chip power ring, which is the region connecting the subalternate bridge working connection region 203 to the subalternate bridge power bonding pads. Moreover, the AGP working connection region 204 represents the bonding pad region connecting the main bridge chip and the AGP component. Wherein, the bonding pads include both signal bonding pads connecting the AGP component and the several ground bonding pads as well as some AGP power bonding pads (marked as "A"). The AGP power ring 204A then represents the region of the main bridge chip power ring, which is the region connecting the AGP working connection region 204 and the AGP power bonding pads. It should be noted in FIG. 2 that the ground bonding pads and the signal bonding pads are depicted as black dots 207 and unfilled circles 208 respectively.

Even though the conventional power layer 13 is partitioned in plane according to the layout in FIG. 2, the power layer after partitioning still cannot be fully used. For example, the region 205 represents the actually utilized power path of the CPU working connection region 201. Since the power path 205 is connected at one side of the CPU working connection region 201, the inductance is not uniformly distributed on both sides of the CPU working connection region 201, causing fluctuation of the supplied voltage. In other words, the inductance level is higher for the CPU located further away from the power path 205, and it is lower for the CPU located closer to the power path 205, causing the supplied voltage to be relatively unstable. In addition, from the distribution of power layer 13 shown in FIG. 2, it can be seen that the power rings 201A, 202A, 203A, and 204A all have different widths. For example, the regions indicated in 202B or 202C depict different widths or missing corners, where the inductance levels of these regions are high. Therefore, when operating under high speeds, the power layer 13 often cannot provide current in a timely manner. This results in a rather large ground/bounce effect, further resulting in unstable high-frequency signals, so as to jeopardize the normal data-processing activities of the entire system.

SUMMARY OF INVENTION

The invention is to provide a layout structure of a motherboard by using a layout of decoupling capacitors to achieve stable power supply for chips operating under high speeds.

In the preferred embodiments of the motherboard in this invention, on the power ring and power path of the top signal layer as well as the bottom soldering layer where the main bridge chip is placed, decoupling capacitors are cross-connected in between the ground bonding pads/solder balls and the power bonding pads/solder balls of the power paths and power rings, so as to provide a stable power supply for the operation of the main bridge chip. Each power path bonding pad/solder ball connected through the decoupling capacitor to the ground bonding pad/solder ball can be the closest power path bonding pad/solder ball to the ground bonding pad/solder ball, and each decoupling capacitor can be connected with multiple power path bonding pads/solder balls with multiple ground bonding pads/solder balls.

Furthermore, on the main bridge chip substrate of this invention, the decoupling capacitors can be placed at the four corners of the circuit layout region, and at the same time, avoid bonding wires. In addition, the decoupling capacitors can be placed underneath the substrate and bonding wires, or they can be packaged together with the main bridge chip into the molding compound, according to the actual design.

BRIEF DESCRIPTION OF DRAWINGS

The invention can be more fully understood by reading the following detailed description of the preferred embodiments. With reference made to the accompanying drawings, wherein.

DETAILED DESCRIPTION OF THE PREFERRED EMBODIMENTS

Figure 1:
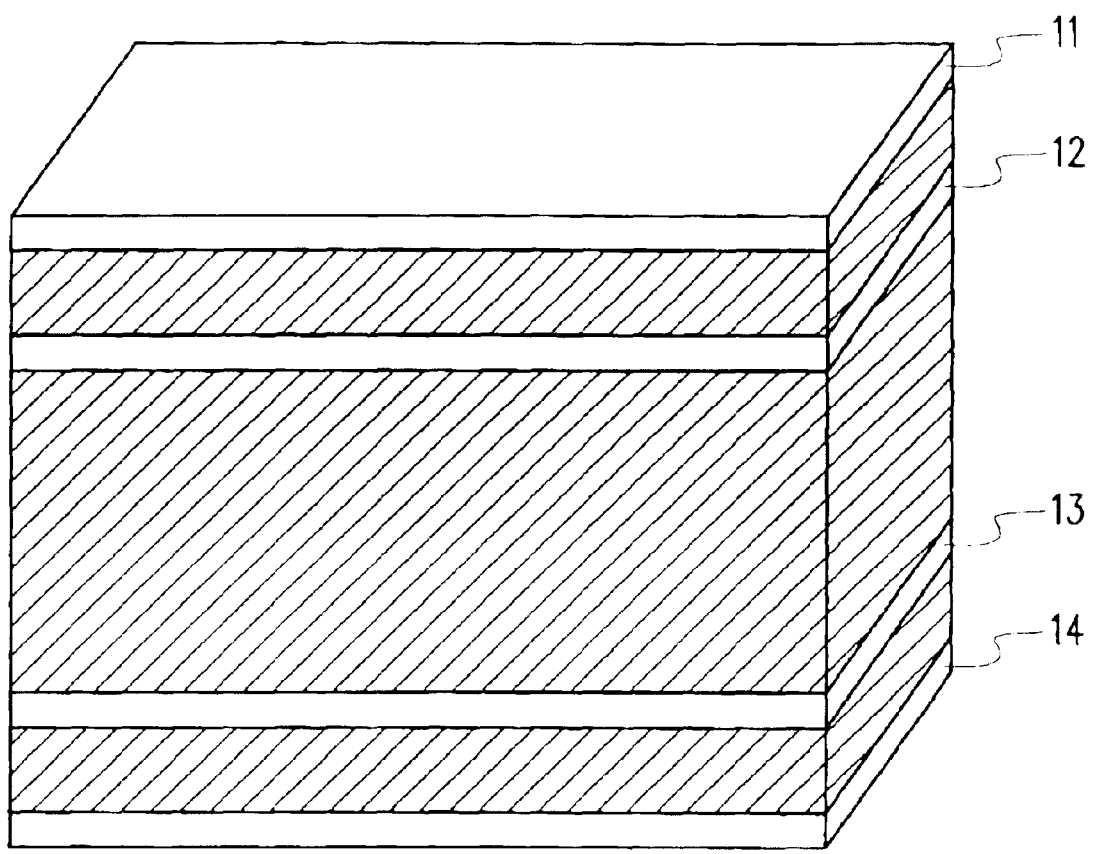
FIG. 1 is a schematic drawing showing a perspective view of a four-layer printed circuit board used for power layout structure.
Figure 2:
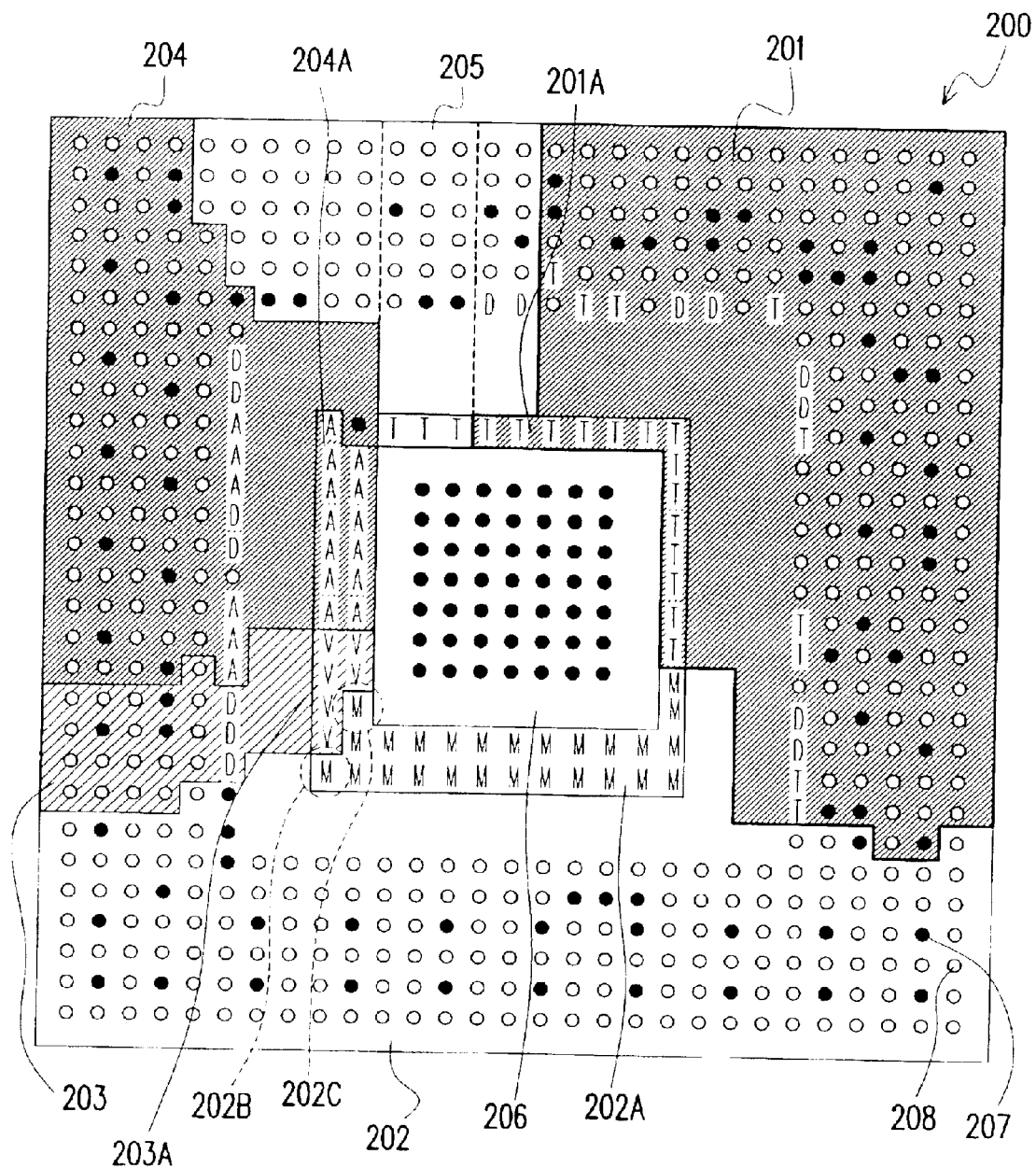
FIG. 2 is a drawing, schematically showing a conventional layout of a motherboard with a power distribution.
Figure 3:
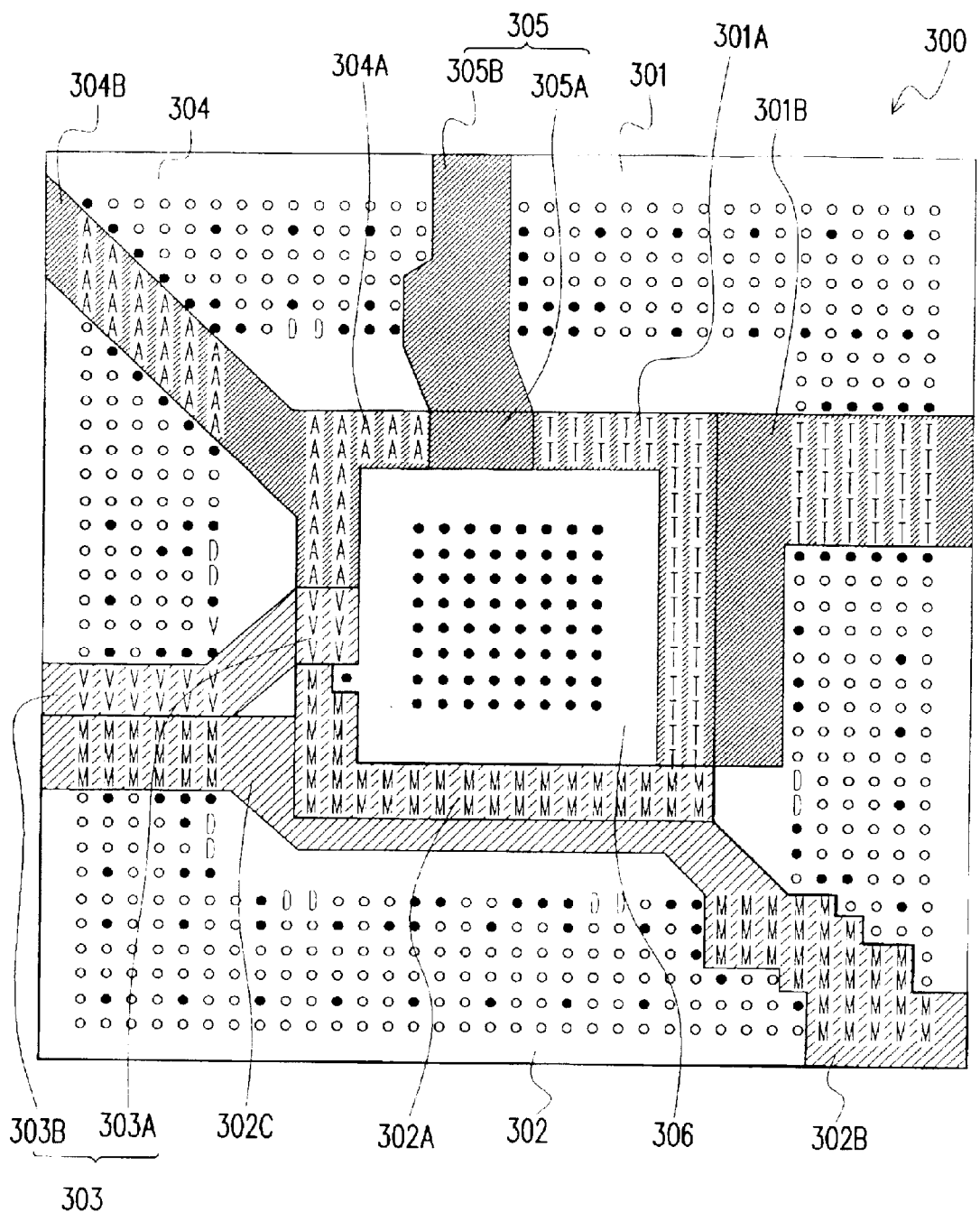
FIG. 3 is a drawing, schematically showing a planar layout of the motherboard with the power distribution in the top signal layer and the bottom solder layer.

Referring to FIG. 3, a schematic drawing of a preferred layout structure of a main bridge chip is shown, where the circuit layout 300 describes the layout structure design of the top signal layer and the bottom solder layer at which the main bridge chip resides. It also describes the power layout of the top signal layer and the bottom solder layer of the motherboard. It should be noted that in order to provide a stable power supply to the circuit, the power layout in the top signal layer needs to be connected with the layout in the bottom solder layer through the vias, so as to increase the area of the power layout. In addition, there are many bonding pads in FIG. 3, where the positions of the bonding pads are decided according to the positions of the related components disposed on the motherboard. Also, the main bridge chip substrate can be soldered to the solder balls on the bottom solder layer to have connection with the motherboard, so as to obtain the related working voltage to the main bridge chip for normal operation.

In FIG. 3, the CPU working connection region 301 represents the region where the main bridge chip and the CPU are connected. This region includes the signal bonding pads connecting to the CPU, it also includes some ground bonding pads (the black dots) and some CPU power bonding pads (marked with "T"). The CPU power ring 301A represents the region of the power ring on the main bridge chip which is located in the CPU working connection region 301 and is connected with a portion of the CPU power bonding pads. The CPU power path 301B is disposed at the center of the CPU working connection region 301, wherein one end of the CPU power path 301B is connected to the CPU power ring 301A, and the other end connects to the CPU. In addition, the memory working connection region 302 represents the region where bonding pads are located for connecting the main bridge chip with the memory. These bonding pads include not only the memory power bonding pads (marked with "M") but also the signal bonding pads connecting the memory and ground bonding pads. The memory power ring 302A represents a region of the main bridge chip power ring, which is the region for the memory working connection region 302 being connected to the memory power bonding pads. Also and, the memory power paths 302B and 302C are respectively connected to the memory power ring 302A and the memory itself (not shown). Further, the subalternate bridge working connection region 303 represents the region where the power bonding pads are located between the main bridge chip and the subalternate bridge chip. The power bonding pads of the subalternate bridge chip (marked by "V") are all arranged within the power ring 303A of the subalternate bridge and the power path 303B of the subalternate bridge. The power ring 303A of the subalternate bridge represents the portion of the main bridge power ring, where it connects to the subalternate bridge power bonding pads and is also part of the subalternate bridge working connection region 303. Moreover, the AGP working connection region 304 represents the bonding pad region for connecting the main bridge chip and the AGP component, wherein the bonding pads include both signal bonding pads connecting the AGP component and the several ground bonding pads as well as some AGP power bonding pads (marked as "A"). The AGP power ring 304A then represents the region of the main bridge chip power ring, which is the region connecting the AGP working connection region 304 and the AGP power bonding pads. The AGP power path 304A is arranged at the center of the AGP working connection region 304, where one end of the AGP power path connects to the AGP power ring 304A while the other end connects to the AGP bus (not shown). A graphic module working connection region 305 represents the region where the power bonding pads are disposed for connecting the main bridge chip with the module, where the module power bonding pads (marked as "D") are all arranged within the graphic module power ring 305A as well as the graphic module power path 305B. The module power ring 305A, therefore, represents the region located in the module working connection region and also connecting to the module power bonding pads. The ground bonding pad region 306 is then arranged to be at the center of the whole layout structure 300, and the above-mentioned power rings 301A–305A then surround the ground bonding pad region 306. Similarly, in the regions 301–305, the ground bonding pads and the signal bonding pads are indicated as the filled dots 307 and the open circles 308, respectively. Furthermore, even more ground bonding pads can be disposed on both sides of the power paths 301B, 302B, 302C, 303, 304B and 305 to provide reference for the power paths. It should be noted that the main bridge chip decides whether to turn on the graphic module working connection region 305 based on if it supports the module. For example, when the main bridge chip does not support the function of the module, the component group working connection region does not respond; on the contrary, when the main bridge chip supports the function of the graphic module, the graphic module can then be operated under the voltage provided by the power solder balls, and then the signals are transferred through the signal bonding pads of the graphic module working connection region 305.

According to the power path layout in FIG. 3, it is noted that unlike the conventional technology in which the power paths are located at one side of the CPU working connection region 301 or AGP working connection region 304, the power paths 301B and 304B are located at the center of the CPU working connection region 301 and AGP working connection region 304 for connecting to the power ring. Therefore, for the CPU working connection region 301 or the AGP working connection region 304, since the power path 301B (or 304B) are located at the center of the working connection region, the inductance level is symmetric on bother sides of the power path 301B (or 304B), and this also results in a lower voltage at the edges of the CPU or AGP working connection region 301, 304, thereby achieving a more stable operation than the existing technology. Further, the power ring comprising 301A, 302A, 303A, 304A and 305A has a very uniform distribution, which means the power ring inductance level has small variation; therefore it can provide a relatively stable current, so as to enable the high speed operation without causing serious ground/bounce effect.

Figure 4:
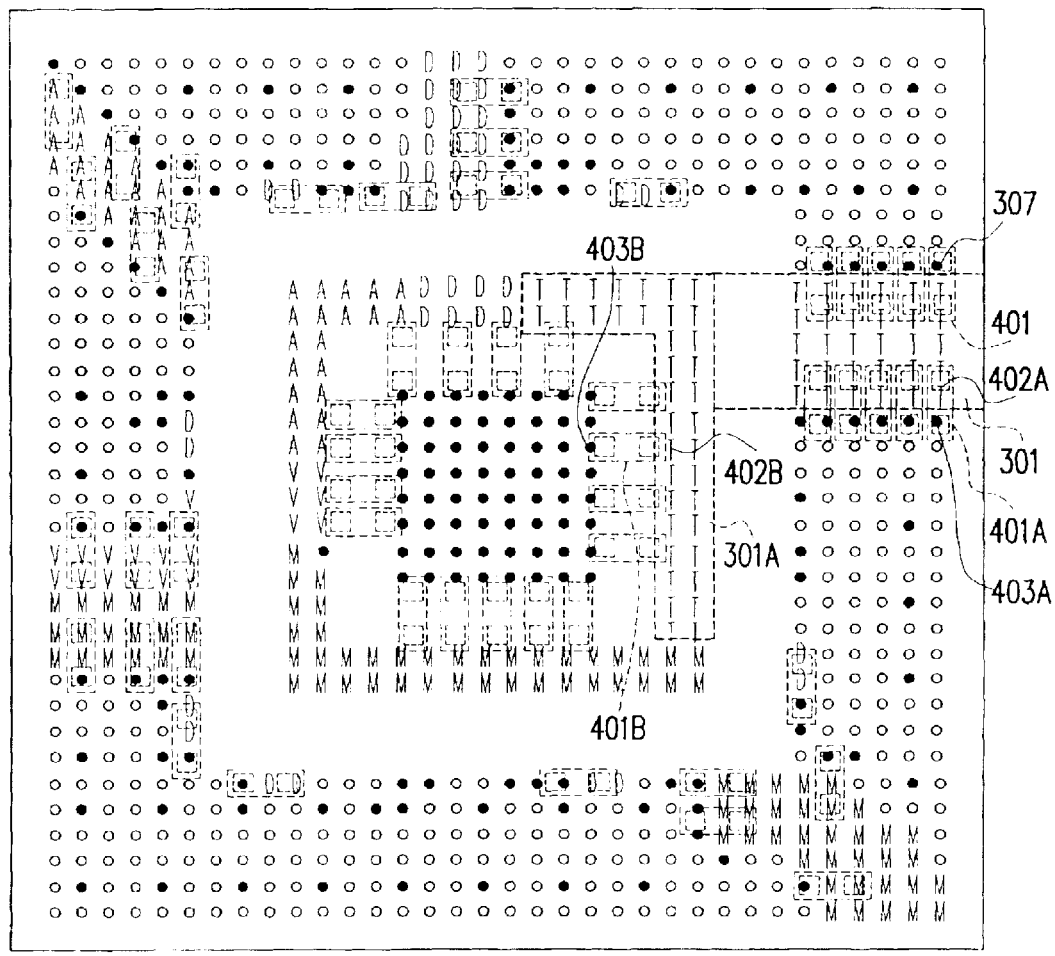
FIG. 4 is a drawing, schematically illustrating layout of a main bridge chip substrate implemented with the decoupling capacitors, according to the preferred embodiment of the invention.

It should be noted that, in the preferred embodiments of this invention, the power path is located at both sides of the memory working connection region 302, unlike the CPU and AGP working connection regions 301, 304 where the power path 301B and 304B are at the center of all the working connection regions. This is because the memory working connection region 302 is where the bonding pads/ solder balls are disposed for connecting the main bridge to the memory, and the memory (for example SDRAM) usually has two power ports. Therefore, the power paths 302B and 302C are specially designed according to the two power ports respectively, thereby assuring the inductance level of the memory working connection region 302 does not have large variation In another preferred embodiment of the invention, in order to provide a stable motherboard operation voltage to the related interfaces, decoupling capacitors are properly connected between the power layouts and the ground bonding pads. FIG. 4 is a schematic drawing showing how the decoupling capacitors are connected in the circuit configuration shown in FIG. 3. For example, as shown in FIG. 4, a group of decoupling capacitors 401 are properly connected between the CPU power path 301B and the ground bonding pads 307 located on a side of the CPU power path 301B (see FIG. 3). Further, another group of decoupling capacitors 401B are connected in between the CPU power ring 301A and the ground bonding pad region 306 shown in FIG. 3 (that is also the connection between the power bonding pads 402B and the ground bonding pads 403B). Similarly, on both sides of all other power paths and power rings including the memory power ring 302A and its power path 302B, the subalternate bridge power ring 303A and its power path 303B, the AGP power ring 304A and its power path 304B, the graphic module power ring 305A and its power path 305B, the decoupling capacitors are also connected in between the power bonding pads and the ground bonding pads. Note that the decoupling capacitors 401A in FIG. 4 can be connected in between the power bonding pads and the closest ground bonding pads for each power path or power ring. For example, for the CPU power path 301B, the closest ground bonding pads to the power bonding pads 402A are the ground bonding pads 403A, and then the decoupling capacitors 401A are thereby connected over between the power bonding pads 402A and the ground bonding pads 403A. Similarly, the decoupling capacitors 401B are then connected on top of and in between the power bonding pads 402B and the ground pads 403B. In real practice, the decoupling capacitors of the preferred embodiments can also be connected in between multiple power bonding pads/ solder balls and ground bonding pads/solder balls at the same time. For example, the decoupling capacitor 401A is connected between two power bonding pads/solder balls and one ground bonding pad/solder ball, and other modifications can be arranged according to the actual design by those skilled in the art. Further, the decoupling capacitors are symmetrically arranged in between the top signal layer and the bottom solder layer. The only difference is that the bottom solder layer is connected in between the power solder balls and the ground solder balls.

Figure 5:
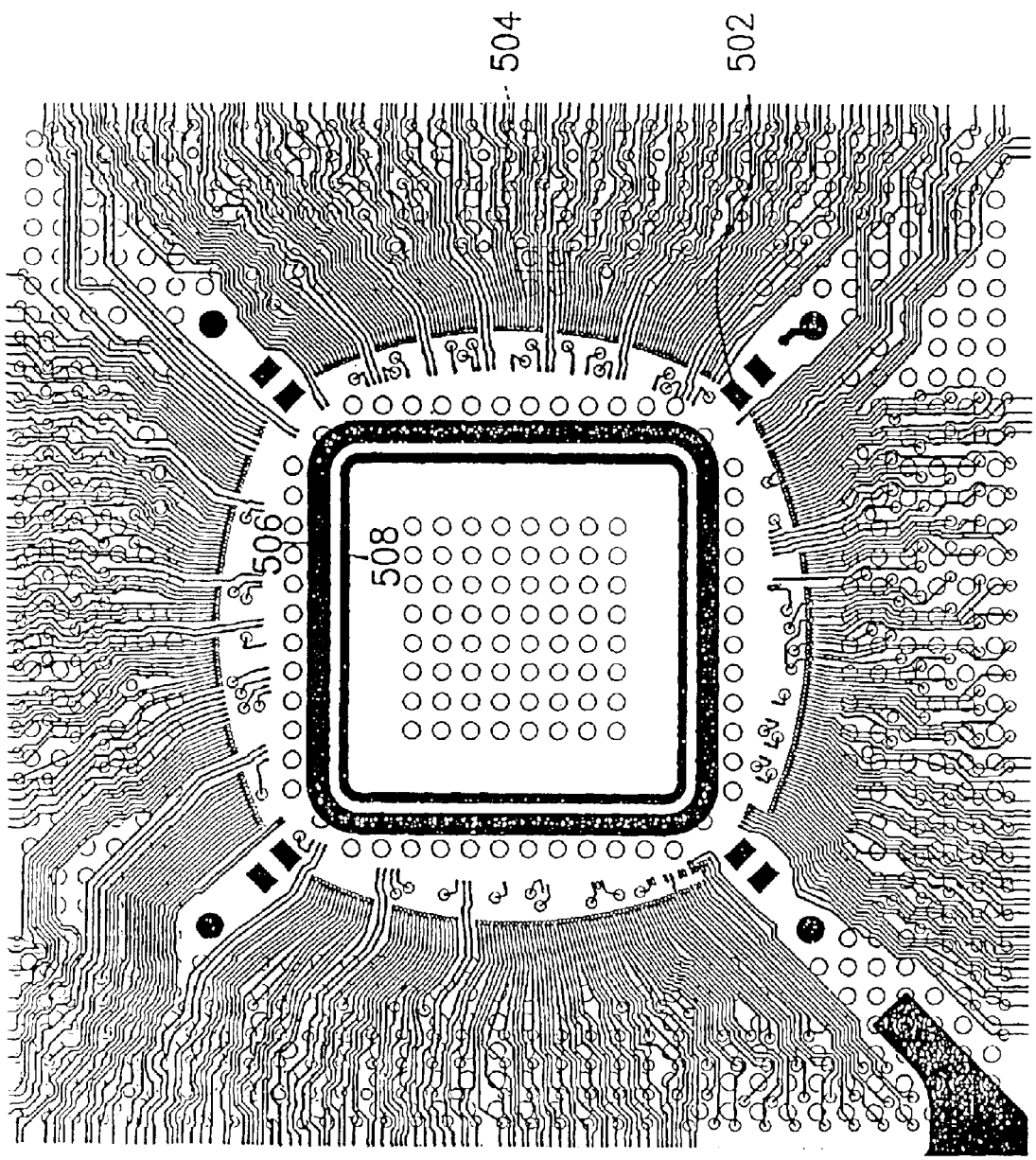
FIG. 5 is a drawing, schematically showing the structure of the main bridge chip substrate implemented with the decoupling capacitors, according to the preferred embodiment of the invention.

FIG. 5 is a circuit layout of a main bridge chip substrate of another preferred embodiment of the invention, where decoupling capacitors can be mounted. According to FIG. 5, decoupling capacitors 502 are arranged close to the four corners outside of the outer power ring 506 (which also encloses an inner power ring 508 inside) and away from the bonding wires region.

Figure 6:
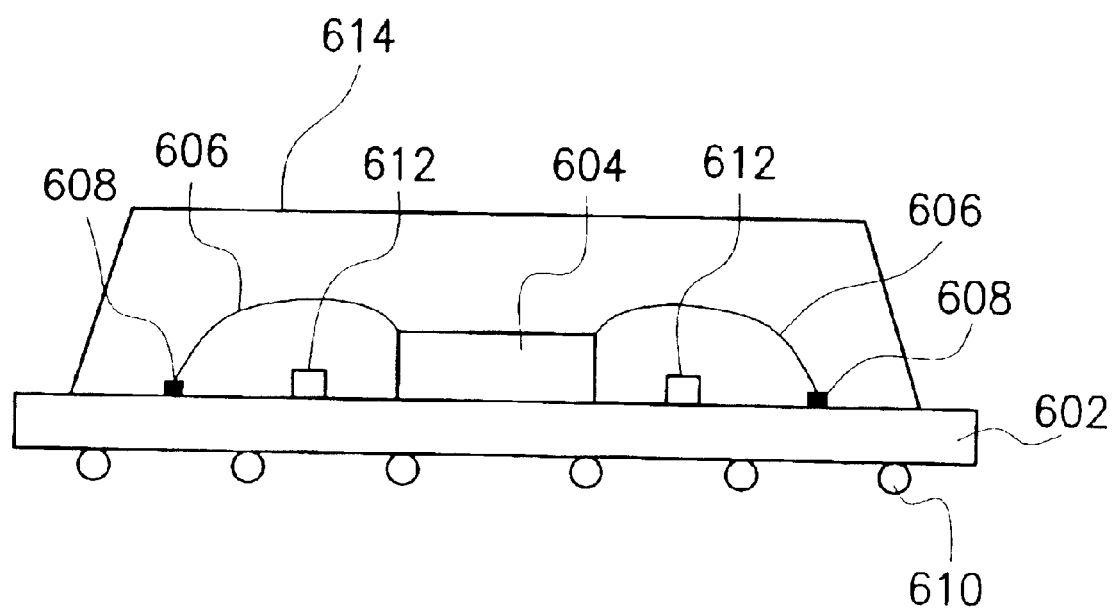
FIG. 6 is a cross-sectional drawing, schematically showing the main bridge chip substrate implemented with the decoupling capacitors, according to the preferred embodiment of the invention.

Practically, the location of the decoupling capacitors can vary according to the actual practice. For instance, the decoupling capacitors can be arranged under the bonding wires, or can be packaged into the molding compound. Referring to the cross section in FIG. 6, die 604 mounted on the main bridge substrate 602 is connected with the bonding pad 608 through the bonding wire 606, and the main bridge substrate 602 is then soldered with the motherboard (not shown) through the bottom solder balls 610. Die 604 and the connected elements are then packaged using material of molding compound 614. As shown in FIG. 6, it is clear that the decoupling capacitor 612 is arranged under the bonding wire 604, and it is also packaged inside the molding compound 614. Note that in actual practice, skilled artisans should be able to decide where to put the decoupling capacitors and whether or not they are packaged into the molding compound However, those variations and changes are all considered to be within the scope of this application of the invention.

In summary, this invention discloses a layout structure for a four—layers of a motherboard and a main bridge chip substrate. The decoupling capacitors, which are located on the motherboard at the top signal layer for arranging the main bridge chip substrate, and at the power rings and the power paths of the bottom solder layer, are connected between the power bonding pads/solder balls and the closest one of the ground bonding pads/solder balls. Thereby, the invention provides stable operation power source for the interfaced devices and dies. Furthermore, the decoupling capacitors in one preferred embodiment can be disposed, according to real practice, at the four corners of the power ring, or underneath the bonding wires, or even packaged inside the molding compound together with the main bridge chip. This allows a great flexibility for the layout structure design.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A power layout structure of a main bridge chip on a motherboard for providing a stable power source to the main bridge chip substrate and the motherboard, comprising:
   a first signal layer which is on top of the layout structure of the main bridge chip, wherein the first signal layer includes at least one power layout layer, wherein the power layout layer further includes at least one decoupling capacitor which is connected between the power layout layer and one of reference bonding pads on a side of the power layout layer;
   a bottom solder layer which is at bottom of the layout structure of the main bridge chip, wherein the bottom solder layer includes at least one power layout layer, wherein the power layout layer further includes at least one decoupling capacitor which is connected between the power layout layer and at least one of reference solder balls on a side of the power layout layer, where the reference bonding pads and the reference solder balls are coupled with a reference voltage source;
   a first voltage reference layer located underneath the first signal layer, wherein the first voltage reference layer is coupled with the reference voltage source to provide a reference voltage to the first signal layer; and
   a second voltage reference layer located on top of the bottom solder layer, wherein the second voltage reference layer is coupled with the reference voltage source to provide a reference voltage to the bottom solder layer.

2. A power layout structure according to claim 1, wherein the first signal layer comprises a plurality of operation working connection regions, and each of the operation working connection regions include a power path.

3. A power layout structure according to claim 1, wherein the decoupling capacitors are connected between the power bonding pads of the power path and the reference bonding pads located on a side of the power path.

4. A power layout structure according to claim 2, wherein each of the reference bonding pads connected through the decoupling capacitors to the power bonding pads is a closest one of the reference bonding pads on a side of the power path to the power bonding pad.

5. A power layout structure according to claim 1, wherein the bottom solder layer is symmetrically configured according to the first signal layer, and a power layout of the first signal layer is symmetric to that of the bottom solder layer.

6. A power layout structure according to claim 5, wherein the decoupling capacitors are connected between the power solder balls of the power path in the bottom solder layer and the reference solder balls located on the sides of the power path.

7. A power layout structure according to claim 5, wherein each of the reference solder balls connected through the decoupling capacitor to the power solder ball is a closest one of the reference solder balls on aside of the power path to the power solder balls.

8. A power layout structure according to claim 1, wherein the first signal layer further includes a voltage reference bonding pad region for coupling with the reference voltage source, and each power path is connected with a power ring, wherein the power rings are disposed about at a center of the power layout structure of the main bridge chip, and all the power rings form a ring-shaped structure surrounding at outside of the reference voltage bonding pad region.

9. A power layout structure according to claim 8, wherein the decoupling capacitors and connected between the power bonding pads of the power ring and the reference bonding pads located on the sides of the power ring.

10. A power layout structure according to claim 8, wherein a voltage reference solder ball region is disposed on the bottom solder layer, according to the voltage reference bonding pad region of the first signal layer, where the voltage reference solder ball region is coupled with the reference voltage source, and each power path of the bottom solder layer is connected with a power ring, where the power ring of the bottom solder layer is placed close to the center of the power layout structure of the main bridge chip, and all the power rings of the bottom solder layer form a ring-shaped structure surrounding at the outside of the reference voltage solder ball region.

11. A power layout structure according to claim 10, wherein the decoupling capacitors are connected between the power solder balls of the power ring in the bottom solder layer and the reference solder balls which are located on a side of the power ring.

* * * * *